(12) United States Patent
Orsley et al.

(10) Patent No.: US 8,917,235 B2
(45) Date of Patent: Dec. 23, 2014

(54) USER CONTROL INPUT DEVICE

(75) Inventors: Timothy J. Orsley, San Jose, CA (US);
Akihiro Machida, Sunnyvale, CA (US);
Tong Xie, San Jose, CA (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 2320 days.

(21) Appl. No.: 11/273,972

(22) Filed: Nov. 14, 2005

(65) Prior Publication Data

US 2007/0109272 A1 May 17, 2007

(51) Int. Cl.
*G09G 5/00* (2006.01)
*G06F 3/0354* (2013.01)
*G06F 1/16* (2006.01)
*G06F 3/03* (2006.01)
*H01L 25/16* (2006.01)
*H01L 27/144* (2006.01)

(52) U.S. Cl.
CPC .......... *G06F 3/03548* (2013.01); *G06F 1/1616* (2013.01); *G06F 1/1632* (2013.01); *G06F 1/169* (2013.01); *G06F 3/0317* (2013.01); *G06F 3/03543* (2013.01); *H01L 25/167* (2013.01); *G06F 2203/0338* (2013.01); *G06F 2203/0384* (2013.01); *H01L 27/144* (2013.01); *H01L 2924/0002* (2013.01)
USPC .......................... 345/156; 345/163; 345/173

(58) Field of Classification Search
USPC ........................ 345/156, 163, 167, 168, 173
See application file for complete search history.

(56) References Cited

U.S. PATENT DOCUMENTS

| | | |
|---|---|---|
| 5,049,863 A | 9/1991 | Oka |
| 5,287,246 A | 2/1994 | Sen |
| 5,490,039 A | 2/1996 | Helms |
| D380,462 S | 7/1997 | Wilson |
| 5,726,684 A | 3/1998 | Blankenship et al. |
| 5,793,355 A | 8/1998 | Youens |
| 5,861,873 A | 1/1999 | Kikinis |
| 5,901,934 A | 5/1999 | Wilson |
| 6,025,986 A | 2/2000 | Sternglass et al. |
| 6,035,350 A | 3/2000 | Swamy et al. |
| 6,070,796 A * | 6/2000 | Sirbu ............................. 235/382 |
| 6,205,021 B1 | 3/2001 | Klein et al. |
| 6,219,037 B1 | 4/2001 | Lee |
| 6,304,249 B1 | 10/2001 | Derocher et al. |
| 6,307,745 B1 | 10/2001 | Liebenow |
| 6,369,798 B1 | 4/2002 | Yatsu et al. |

(Continued)

OTHER PUBLICATIONS

Ron Shaw, "Industry Transition from PC Card to Expresscard Technology", Dell Technology, White Paper, Sep. 2003, available at www.dell.com/r&d.

(Continued)

*Primary Examiner* — Lun-Yi Lao
*Assistant Examiner* — Shaheda Abdin

(57) ABSTRACT

An optical input card is shaped and sized for removable slidable insertion within a slot of a portable computer. The optical input card comprises an optical navigation sensor, a control panel and a wireless communication module. The optical navigation sensor is disposed on the first side of the card for exposure to a navigation surface and is configured to capture a first user control input. The control panel on a second side of the card is configured to capture at least one second user control input. The wireless communication module is configured to wirelessly communicate the first user control input and the at least one second user control input to the portable computer.

5 Claims, 12 Drawing Sheets

(56) References Cited

U.S. PATENT DOCUMENTS

| | | |
|---|---|---|
| 6,424,335 B1 | 7/2002 | Kim et al. |
| 6,442,019 B1 | 8/2002 | Lim |
| 6,476,795 B1 | 11/2002 | Derocher et al. |
| 6,511,039 B1 | 1/2003 | Nash |
| 6,872,931 B2 | 3/2005 | Liess et al. |
| 6,970,156 B1 * | 11/2005 | Silverstein .................... 345/163 |
| 7,233,319 B2 * | 6/2007 | Johnson et al. ............... 345/166 |
| 7,359,183 B2 | 4/2008 | Wu et al. |
| 2003/0117370 A1 | 6/2003 | Van Brocklin et al. |
| 2003/0132914 A1 | 7/2003 | Lee |
| 2004/0030412 A1 | 2/2004 | Huang |
| 2004/0046741 A1 | 3/2004 | Low et al. |
| 2004/0140955 A1 * | 7/2004 | Metz ............................. 345/166 |
| 2004/0208348 A1 | 10/2004 | Baharav et al. |
| 2005/0057339 A1 * | 3/2005 | Ikehara et al. ............... 340/5.52 |
| 2005/0057523 A1 | 3/2005 | Moyer |
| 2006/0043198 A1 | 3/2006 | Forster |

OTHER PUBLICATIONS km-1006 RF Wireless Optical Mouse, Chuang Feng Electronics Co Ltd, 2 pages, printed on Nov. 14, 2005 from www.hitom.manufacturer.globalsources.com.

* cited by examiner

USER CONTROL INPUT DEVICE

BACKGROUND

Portable computing has transformed the way we work and play. The notebook computer has become a common business staple, seemingly ever-present in places like airports and coffee shops. One of the enticing features of notebook computers is their fully inclusive nature, such as an embedded keyboard, display, and pointing devices such as capacitive input sensor (e.g., a TouchPad™ input pad). Accordingly, the notebook computer conveniently offers an all-in-one computer experience for the user on the go.

Despite this integration of features, regular computer users often continue to use their favorite peripheral devices alongside a notebook computer, either out of habit or because of real and perceived performance advantages. In one example, computer users continue to use an optical mouse external to the notebook computer as a pointing device despite the presence of a capacitive input sensor integrated into the notebook computer. Many users experience more precise navigation with the external optical mouse, as well as avoidance of the awkward combination of input buttons and a separate capacitive input sensor, as typically found on most notebook computers.

However, an external optical mouse is subject to loss, theft, or damage during transport. Accordingly, an external optical mouse presents a tradeoff between optimal performance and ergonomics versus the annoyance of transporting an optical mouse external of the portable computer.

SUMMARY

Embodiments of the invention are directed to capturing a user control input via an optical input card for a portable computer. In one embodiment, an optical input card is shaped and sized for removable slidable insertion within a slot of a portable computer. The optical input card comprises an optical navigation sensor, a control panel and a wireless communication module. The optical navigation sensor is disposed on the first side of the card for exposure to a navigation surface and is configured to capture a first user control input. The control panel on a second side of the card is configured to capture at least one second user control input. The wireless communication module is configured to wirelessly communicate the first user control input and the at least one second user control input to the portable computer.

DETAILED DESCRIPTION

Figure 1:
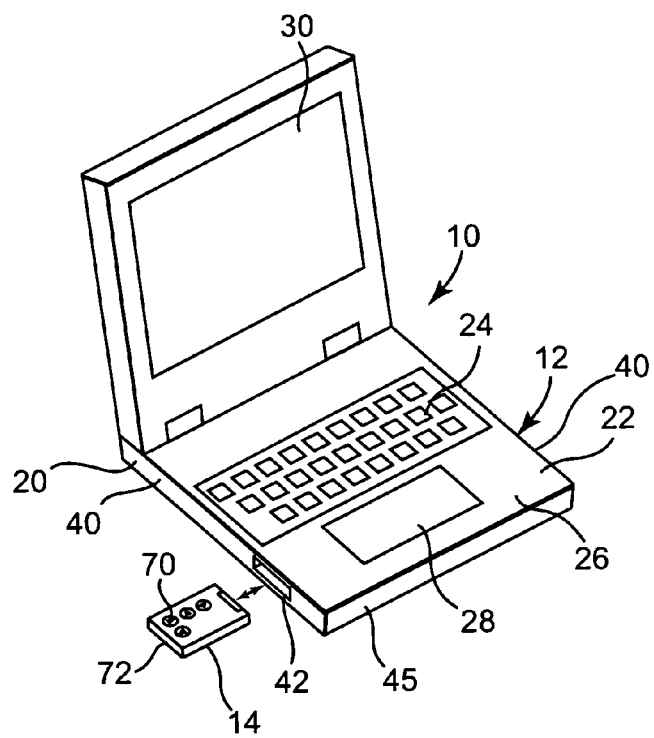
FIG. 1 is an isometric view of a system including an optical input card and a portable computer, according to an embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Embodiments of the invention are directed to capturing user control inputs via an optical input card configured for multi-mode use. In one embodiment, the optical input card is a self-contained, fully functional mouse that is sized and shaped for removable insertion into a slot in a housing of a portable computer. The optical input card comprises a first side including an optical navigation sensor for capturing a first user control input and a second side comprising a control panel for capturing at least one second user control input. The slot in the portable computer is configured for storage of the optical input card, as well as recharging of a battery of the optical input card. In one embodiment, the slot is sized and shaped for receiving a PC Card (e.g., a wireless adapter card, modem card, etc.) or an ExpressCard, with the optical input card having a size and shape corresponding to the PC Card or ExpressCard format, respectively.

Upon removal of the optical input card from the slot of the portable computer or prior to insertion of the optical input card into the slot of the portable computer, the optical input card is placed on a navigation surface for capturing the first user control input via slidable movement of the first side of the optical input card relative to the navigation surface. A wireless communication module within the optical input card communicates captured user control information from the optical input card to the portable computer to control a function of the portable computer. In one aspect, the navigation surface is positioned on an upper surface of a housing of a portable computer, such as on the wrist-rest portion of the portable computer. In another aspect, the navigation surface is external to the housing of the portable computer, such as a mouse pad or desktop surface.

In another aspect, the navigation surface is provided by a fingertip of the user (e.g., a thumb) that is slidably moved relative to an optical navigation sensor of the optical input card. The optical input card is held within the hand of the user with the optical navigation sensor facing upward to enable placement of a thumb of the same hand over the optical navigation sensor to detect relative motion between the thumb (as it is moved) relative to the optical navigation sensor. This mode of use enables remote control of a video display of a portable computer (e.g., a PowerPoint™ presentation) via slidable movement of the thumb while holding the optical input card.

In one embodiment, after use the optical input card is removably inserted into the slot of the portable computer for storage and/or recharging.

In another mode of use, the portable computer includes an input interface in an upper portion of the housing of the portable computer, such as a wrist-rest portion of a notebook computer. The input interface comprises a slot defined as part of the wrist-rest portion of the portable computer and configured to enable slidable insertion of the optical input card to orient the optical navigation sensor of first side of the optical input card facing upward in an exposed position. The input interface also includes a slider (or puck) that defines a navigation surface on its bottom surface. The slider is coupled at the input interface for slidable movement over and relative to the exposed optical navigation sensor of the optical input card for capturing user control inputs based on detection (by the optical navigation sensor) of relative motion between the navigation surface of the slider and the optical navigation sensor.

In another mode of use, the optical input card is removably insertable into a mouse shell so that the optical input card provides an optical navigation sensor for the mouse shell. In this mode, the mouse shell includes its own control buttons and/or scroll wheel for capturing various user control inputs but does not include its own optical navigation sensor. However, upon insertion of the optical input card into a slot of the mouse shell, the insertable optical input card enables capture of user control inputs based on movement of the optical navigation sensor (now removably coupled to the mouse shell) relative to a navigation surface (e.g., a mouse pad) via hand positioning of the mouse shell over the navigation surface.

In another mode of use, the optical input card includes a remote video control button so that upon removal of the optical input card from the slot of the portable computer, the optical input card provides a remote mechanism for controlling a video display associated with the portable computer. In one aspect, this remote control button is used in cooperation with the finger-based navigation for remote control of a video display, as previously described.

In another mode of use, the optical input card includes a biometric identification mechanism configured to identify an individual for granting access to the portable computer. In one aspect, fingerprint identification of the user is determined via swiping a finger of the user relative to the optical navigation sensor.

The universal optical input card of the embodiments of the invention provides an enhanced mobile computing experience by providing a low profile, fully functional mouse that is separable from a housing of a portable computer, yet is stowable within the housing of the portable computer when not in use. This arrangement avoids transporting an external optical mouse separately from the portable computer. By configuring the size and shape of the optical input card to substantially match (in some embodiments) an already commercially established slot of a portable computer, the optical input card enables conservation of the valuable space within the portable computer that is already devoted to audio components, memory components, power components, etc. Moreover, the size and shape of the optical input card also enables many other modes of use that are not readily achievable with an external conventional optical mouse or by conventional on-board input devices of portable computers.

Accordingly, embodiments of the invention provide a universal optical input card configured for interchangeable use in a plurality of different modes of use. These embodiments, and additional embodiments of the invention, are described and illustrated in association with FIGS. 1-18.

FIG. 1 is an isometric view of a system 10 including a portable computer 12 and an optical input card 14, according to one embodiment of the invention. Optical input card 14 captures user control inputs for controlling selectable functions of the portable computer 12, such as cursor control for a graphic user interface of the portable computer 12, scrolling functions, navigating menu functions, selectable communication functions, etc.

As also shown in FIG. 1, portable computer 12 comprises housing 20 and display 30. In one embodiment, housing 20 includes an upper portion 22 defining a keyboard 24 and a wrist-rest portion 26 that includes input interface 28. Input interface 28 comprises one of several different types of input interfaces cooperable with optical input card 14, as described in association with FIGS. 2-18.

Housing 20 of portable computer 12 also comprises side portions 40 and front portion 45 with the side portions 40 and front portion 45 defining an edge portion of housing portion 20. Housing portion 20 also comprises a slot 42 defined in one of side portions 40 and/or front portion 45. Slot 42 is sized and shaped to removably receive optical input card 14 via slidable insertion to enable storage of optical input card 14 and/or to enable operation of other functions of optical input card 14.

In one embodiment, optical input card 14 comprises a first side 72 (e.g., a bottom side as shown in FIG. 1) including optical navigation sensor and a second opposite side 70 (e.g., a top side as shown in FIG. 1) including a control panel, as further illustrated and described in association with FIGS. 2-18. Optical input card 14 is sized and shaped for insertion into slot 42 of housing 20 of portable computer 12, as well as for operation externally of portable computer 12, as shown in at least FIGS. 2-5. In one aspect, optical input card 14 is a self-contained wireless optical mouse configured to capture a first user control input via its optical navigation sensor and to capture a second user control input via its control panel. In another aspect, optical input card 14 includes a generally rectangular shape and has a low profile with a substantially uniform thickness.

In one embodiment, slot 42 of housing 22 of portable computer 12 defines a PC Card slot (e.g., Type II or III) or an ExpressCard slot (e.g., ExpressCard|34 or ExpressCard|54), according to the Personal Computer Memory Card International Association (PCMCIA) standards. In one embodiment, optical input card 14 has a size and shape (e.g., thickness, width, length) conforming to the PC Card format or the ExpressCard format standards to enable removable slidable insertion of optical input card 14 into slot 42.

In another embodiment, slot 42 and optical input card 14 define a size and shape other than (larger or smaller than) the PC card or Express card format. In one embodiment, a thickness of the card is about one-tenth of a width of the card, and about one-twentieth of a length of the card. In another embodiment, a height (e.g., a thickness) of the optical input card 14 is substantially less than a width of the optical input card 14. In one aspect, the height of the optical input card 14 is on the order of 5 to 10 times less than the width of the optical input card 14.

Figure 5:
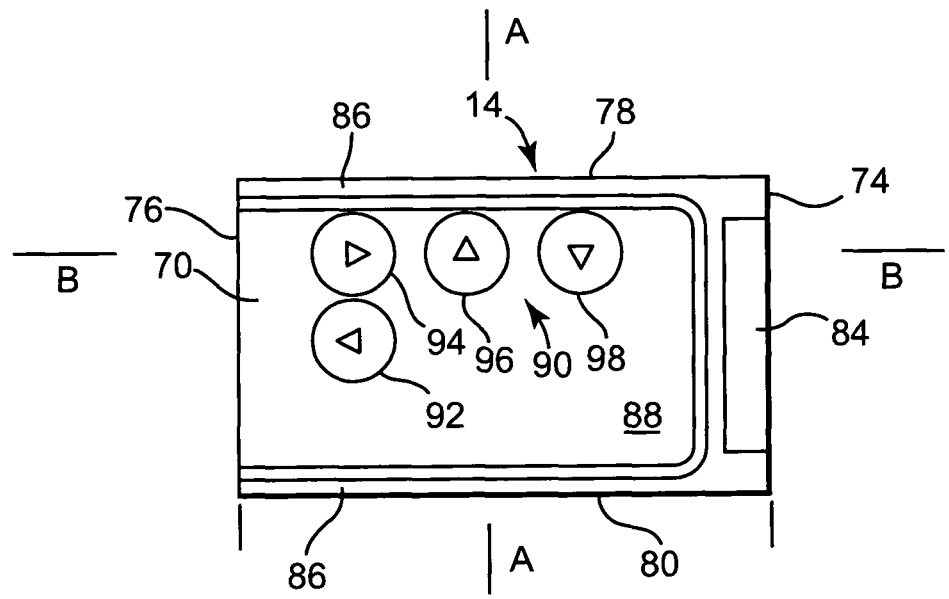
FIG. 5 is a top plan view of an optical input card, according to an embodiment of the present invention.
Figure 6:
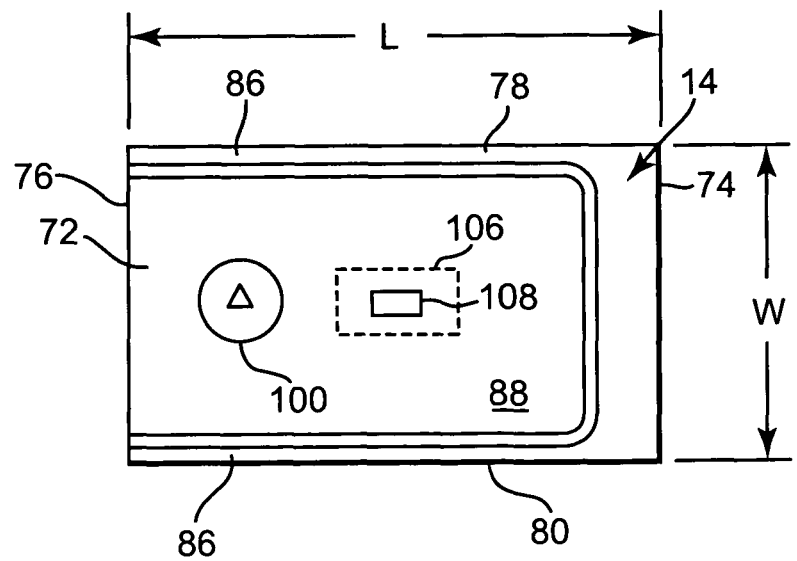
FIG. 6 is bottom plan view of an optical input card, according to an embodiment of the invention.
Figure 7:
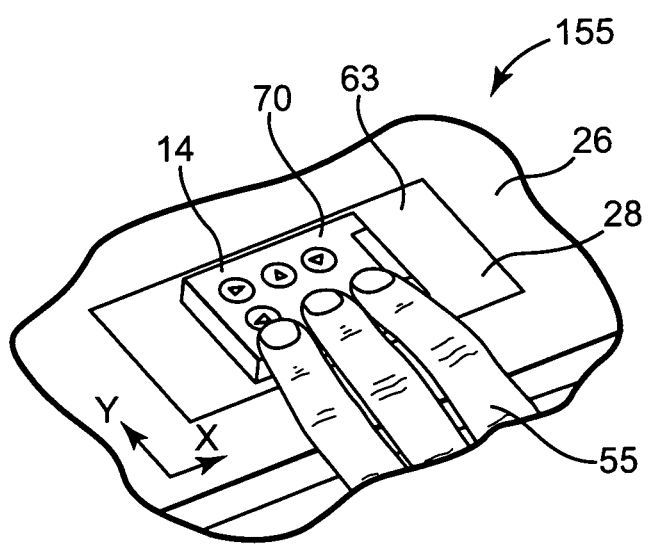
FIG. 7 is an isometric view of one mode of use of an optical input card, according to an embodiment of the present invention.

Optical input card 14 enables capturing a first user control input and a second user control input via an optical navigation sensor, a control panel, and a wireless communication module, as further described in association with FIGS. 5-7. The wireless communication module is configured to wirelessly communicate to portable computer 12 the user control inputs captured via the optical input card 14. In another embodiment, optical input card 14 omits wireless communication module and user control inputs captured via optical input card 14 are communicated to the portable computer via a wired connection between the optical input card 14 and the portable computer.

Optical input card 14, as well as portable computer 12, including their structure, functions, and multiple modes of use in their capturing user control inputs, are described in more detail in association with FIGS. 2-18.

Figure 2:
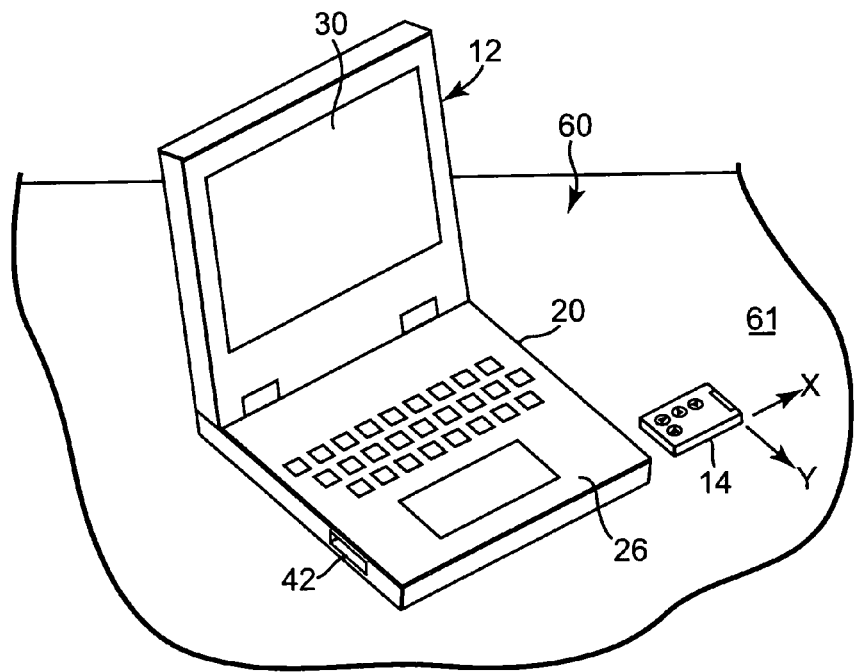
FIG. 2 is an isometric view of one mode of use of an optical input card, according to an embodiment of the invention.
Figure 3:
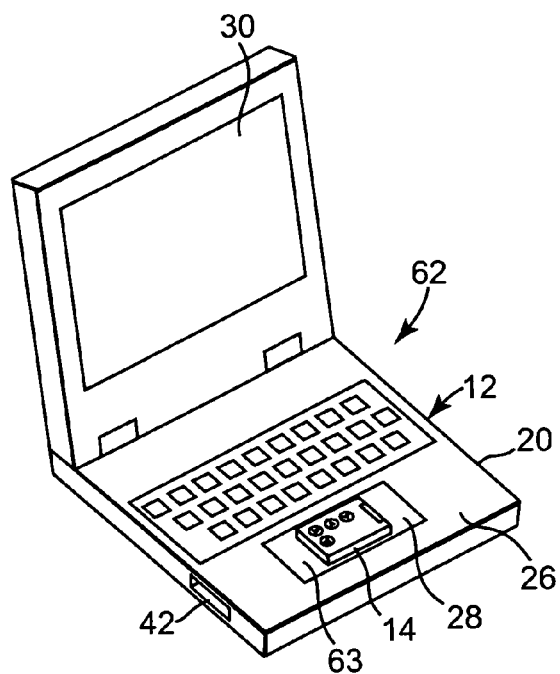
FIG. 3 is an isometric view of one mode of use of an optical input card, according to an embodiment of the invention.
Figure 4:
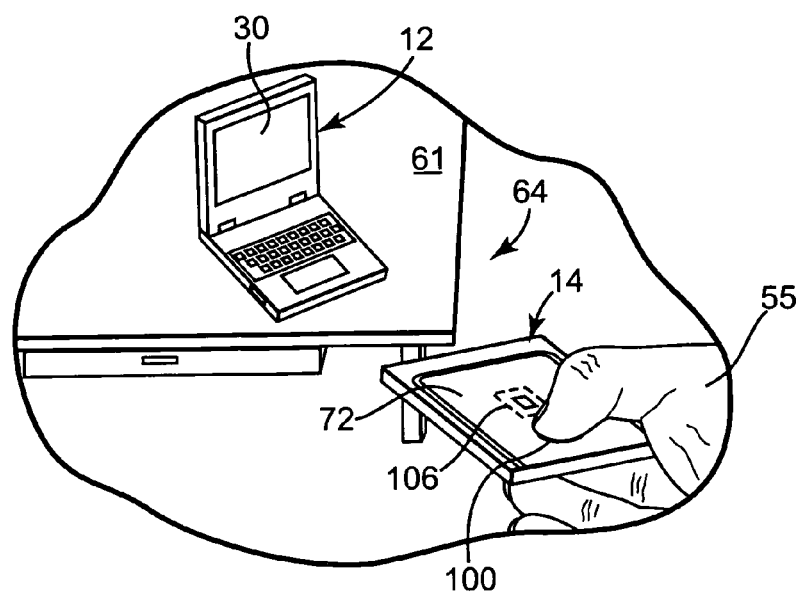
FIG. 4 is a perspective view of one mode of use of an optical input card, according to an embodiment of the invention.

FIGS. 2-4 describe several modes of use of optical input card 14, among other modes of use of optical input card described later. FIG. 2 is an isometric view of portable computer 12 with optical input card 14 placed on a desktop or other surface such as a mouse pad that acts as navigation surface 61 external to the portable computer 12, in one mode 60 of use according to one embodiment of the invention. In this mode 60, optical input card 14 is slidably movable relative to the navigation surface 61 for capturing user control inputs such as intended control of a cursor movement on display 30 of portable computer 12, among other user control inputs described later.

FIG. 3 is an isometric view of portable computer 12 with optical input card 14 placed on navigation surface 63 of input interface 28 on wrist-rest portion 26 of portable computer 12, in one mode 62 of use according to one embodiment of the invention. In this mode 62, optical input card 14 is slidably movable relative to the navigation surface 63 for capturing user control inputs such as intended control of a cursor movement on display 30 of portable computer 12. In one embodiment, the pattern of navigation surface 63 enables absolute positioning of a cursor based on a generally one-to-one correspondence between movement on the navigation surface 63 and movement of a cursor (controlled by optical input card 14) on a display 30 of the portable computer 12. In one aspect, navigation surface 63 forms a recessed portion of wrist-rest portion 26 of portable computer 12 to define an edge that limits the range of motion of optical input card 14 on navigation surface 63.

FIG. 4 is an perspective view of a portable computer 12 with optical input card 14 being held in a hand of a user to enable use of either a remote control function or a biometric identification of a user, in other modes 64 of use according to one embodiment of the invention.

As shown in FIG. 4, in one mode of use, according to an embodiment of the invention, a biometric identification mechanism is disposed on first side 72 of optical input card 14 and configured to identify an individual for granting access to the portable computer based on a fingerprint identification of the user. In one embodiment, the biometric identification mechanism comprises a method of fingerprint identification based on swiping a fingertip of a hand 55 across the optical navigation sensor 106 of the optical input card 14 is described further in association with FIGS. 5-7.

As shown in FIG. 4, in another mode of use, the navigation surface is provided by a fingertip of the user (e.g., a thumb) that is slidably moved relative to optical navigation sensor 106 of the optical input card 14 to enable remote control of a video display of a portable computer (e.g., a PowerPoint™ presentation).

As shown in FIG. 4, in a related mode of use, according to one embodiment of the invention, first side 72 of optical input card 14 comprises a control button 100 (FIG. 6) configured to provide a click-function for remotely controlling a video display associated with the portable computer.

FIG. 5 is a top plan view of second side 70 of optical input card 14, according to one embodiment of the invention, and FIG. 6 is a bottom plan view of first side 72 of optical input card 14, according to one embodiment of the invention. Optical input card 14 comprises substantially the same features and attributes as optical input card as described in association with FIGS. 1-4.

As shown in FIG. 5, optical input card 14 comprises the second side 70, first end 74, second end 76, first edge 78 and second edge 80. In one embodiment, second side 70 of optical input card 14 also comprises rails 86 and body portion 88. In one aspect, rails 86 act as contact shoes to facilitate low-friction slidable movement of optical input card 14 over a navigation surface. However, in another embodiment, second side 70 omits rails 86. In one aspect, body portion 88 defines a substantially continuous planar surface.

In one embodiment, optical input card 14 comprises a first connector 84 disposed at end 74 of optical input card 14 for releasable connection to a second connector within slot 42 of housing 20 of portable computer 12. In one embodiment, first connector 84 of optical input card 14 is configured to enable portable computer 12 to recharge a battery of optical input card 14 (shown in FIG. 7). In another embodiment, first connector 84 of optical input card 14 enables communication between circuitry within optical input card 14 and portable computer 12.

As further shown in FIG. 5, a control panel 90 is disposed on the second side 70 of the card for capturing at least one second user control input such as activating a function associated with a position of a cursor on a display 30 (e.g., a graphical user interface). In one embodiment, control panel 90 comprises first button 92, second button 94, third button 96 and fourth button 98. However, in other embodiments, control panel 90 comprises more or less than four buttons. In one embodiment, first button 92 comprises a left-click button and second button 94 comprises a right-click button while third button 96 comprises an up-scrolling button and fourth button 98 comprises a down-scrolling button. In this orientation, a user conveniently moves their index finger between the first button 92 and the second button 94 for alternative left-click or right-click functionality. At the same time, the middle finger and ring finger of the same hand also remain in contact with second side 70 of optical input card 14 to control positioning of optical input card 14 as well to maintain placement of the middle and ring fingers on the scrolling functions of third button 96 and fourth button 98. Of course, one can slidably move optical input card 14 via application of fingertip pressure on second side 70 without having their fingers on any of control buttons 92-98.

In other embodiments, the buttons 92-98 are arranged in a different layout (e.g., for left handed users) and/or define other functions for capturing user control inputs.

In one embodiment, buttons 92-98 of control panel 90 are incorporated into body portion 88 to partially define the substantially continuous planar surface of body portion 88. In other words, second side 70 omits raised buttons or discontinuities and gaps associated with the juxtaposition of conventional buttons and/or scroll wheels on a conventional mouse. In one aspect, control buttons 92-98 comprise pressure activated sensors.

In one embodiment, buttons 94-98 of control panel 90 define a generally elongate array of buttons. In another aspect, the elongate array of buttons 94-98 is generally parallel to a longitudinal axis of card that extends through first end 74 and second end 76, as represented by line B. In another aspect, the elongate array of buttons 94-98 is also generally parallel to side edge 78 of the card and/or generally perpendicular to a longitudinal axis of an arm of a user (as represented by line A) from which fingertip(s) extend for placement on buttons 94-98.

In one aspect, this elongate array of buttons 94-98 of control panel 90 results in an optical mouse having a substantially different orientation than a conventional mouse because the body portion 88 of optical input card 14 need not be aligned and/or shaped to fit a palm of user as in a conventional mouse. Instead, this configuration of control panel 90 and substantially planar body portion 88 enables control of the optical input card 14 exclusively with the fingertips, being freed from palm-based or whole-hand based gripping of a conventional mouse (in which the palm, thumb, and little finger typically interact with the conventional mouse to direct its positioning). Moreover, because of the relatively low mass of optical input card 14, minimal force is used to slidably move optical input card 14, thereby further facilitating its simple fingertip control. Accordingly, optical input card 14 enables a different ergonomic experience than a conventional mouse.

In another embodiment, control panel 90 is aligned on second side 70 of optical input card 14 to extend generally perpendicular to a longitudinal axis of optical input card 14 instead of being aligned generally parallel to a longitudinal axis of optical input card 14.

As shown in FIG. 6, optical input card 14 comprises first side 72 which includes control button 100 and optical navigation sensor 106 (represented by dashed lines) with transparent window 108 (e.g., an sealed or unsealed opening) for permitting transmitted and reflected light to pass to and from optical navigation sensor 106. In another embodiment, first side 72 omits control button 100. As also shown in FIG. 6, optical input card 14 has a length (L), a width (W), and a height corresponding to a thickness of optical input card 14.

In use, user control inputs are captured via applying fingertip control to the first side 72 and/or second side 70 of optical input card 14. In one embodiment, with the first side 72 of optical input card 14 placed on a navigation surface, a user applies fingertip pressure on the second side 70 of the optical input card 14 to cause slidable movement of the first side 72 of optical input card 14 relative to the first navigation surface to capture the first user control input based on an x-y position of the optical input card 14 relative to the first navigation surface. In one aspect, optical navigation sensor 106 of card detects relative motion between the optical navigation sensor 106 and the first navigation surface. In another aspect, the fingertip(s) of the user are applied to activate one or more buttons of the control panel 90 on the second side 70 of the card to capture the second user control input (in coordination with capturing the first user control input).

In one aspect, optical navigation sensor 106 on first side 72 of optical input card 14 acts a biometric identification mechanism configured to uniquely identify an individual for granting access for the computing device. In this aspect, optical navigation sensor 106 operates to obtain a series of images detected as a fingertip is swiped past optical navigation sensor 106. The series of images captured via optical navigation sensor 106 are then used to uniquely identify an individual associated with characteristics of that fingertip. In one aspect, the images and other information associated with images of the swiped finger are communicated from the optical input card 14 to a host, such as a portable computer 12, for processing and comparison with a database of known fingertip characteristics (e.g., stored fingerprint images of one or more individuals). Accordingly, the memory intensive and processor-power intensive processing associated with biometric identification need not be performed on-board the optical input card 14.

In another aspect, the low profile size and shape of optical input card 14 facilitates grasping optical input card 14 in a single hand and using a thumb (or other finger) as a navigation surface for slidable movement relative to optical navigation sensor 106 of optical input card 14. In this aspect, as also illustrated in FIG. 4, optical input card 14 enables free hand use apart from a mouse pad or desktop (or other fixed navigation surface) in which several fingers (e.g., one, two, three or four) of one hand are positioned on the second side 70 of optical input card 14 and the thumb of the same hand is positioned on the first side 72 of optical input card 14. In one aspect, this opposed thumb-finger arrangement enables exclusive fingertip control of optical input card 14, apart from use of the palm of the hand, to enable simultaneous fingertip activation of control panel 90 on second side 70 of optical input card 14 and fingertip navigation relative to optical navigation sensor 106 on first side 72 of optical input card 14 (or of control button 100). In another aspect, control panel 90 comprises the elongate array of buttons 94-98 aligned generally parallel to a longitudinal axis of optical input card 14 (FIG. 5) which generally aligns the fingertips on buttons 94-98 when the opposed thumb-finger grip is used. In another aspect, control panel 90 comprises a different arrangement or layout of buttons 92-98 on second side 70 of optical input card 14.

In another aspect, control button 100 of optical input card enables capturing a third user control input, such as click function, for remotely controlling a visual display function of the portable computer via the wireless communication module, as previously described in association with FIG. 4.

FIG. 7 is an enlarged view of an optical input card 14 and navigation surface 63 generally corresponding to FIG. 3, except further illustrating application of fingertip control to cause slidable movement of input card 14 (as represented by coordinate arrows x-y) as well as positioning of adjacent fingers 55 to activate one or more buttons on control panel 90 of input card 14.

As shown in FIG. 7, one or more fingers of a first hand are positioned on second side 70 of optical input card 14 to slide the optical input card 14 into desired positions and directions while one or more adjacent fingers of the same hand are applied on substantially the same surface (i.e. the second side 70 of optical input card 14) to activate functions associated with the portable computer 12.

Fingertip pressure that is applied exclusively on second side 70 of optical input card 14 enables adjacent fingers (e.g., index and middle, or middle and ring, or index and ring) to capture both a first user control input and a second user control input without moving either one of those fingers off optical input card or without using a two handed operation, as would occur in a conventional capacitive input pad (e.g., a Touchpad™ device).

In one aspect, this arrangement of exclusive fingertip control on a single surface (e.g. second side 70) of optical input card 14 also enables an integrated point-and-click function in which the first user control input comprises a position of a cursor on a display 30 of portable computer 12 and the second user control input comprises activation of a parameter of a computer software program based on the position of the cursor on the display 30. In this instance, the second user control input is activated via one of first button 92 and second button 94 while the first user control input of the cursor position is activated via slidable positioning of optical input card 14 (and its optical navigation sensor) over a navigation surface 63.

In another aspect, this arrangement of exclusive fingertip control on a single surface (e.g. second side 70) of optical input card 14 also enables an integrated click-and-scroll function in which the second user control input captured via control panel 90 (e.g. third button 96 and fourth button 98) activates a scrolling function (e.g., up or down display movement) on display 30 of portable computer 12.

In one embodiment, a scroll function is activated as an integrated click-and-scroll function in which one finger is continually activates of a scroll function (e.g., one of first button 92 or second button 94) to cause scrolling on display 30 based on the movement or position of the optical input card 14 relative to its navigation surface with the speed and direction of scrolling corresponding to the speed and direction of movement of the optical input card.

In another aspect, this arrangement of exclusive fingertip control on a single surface (e.g. second side 70) of optical input card 14 also enables an integrated click-and-drag function in which the second user control input corresponds to activation (via control panel 90) of a drag function on display 30 of portable computer 12 and the first user control input corresponds to dragging an object on display 30 via the activated drag function (e.g. the captured second user control input).

While these integrated "click-and-position" functions are usable via optical input card 14 on navigation surfaces 61 (FIG. 2) external to housing 20 of portable computer 12, they are also advantageous when deployed on a navigation surface 63 on wrist-rest portion 26 of portable computer 12, as previously shown in FIG. 3. In this latter aspect, when deployed on navigation surface 63 on wrist-rest portion 26 of portable computer 12 as shown in FIG. 7, optical input card 14 avoids an awkward split finger operation that occurs with conventional input pads of portable computers.

Figure 8:
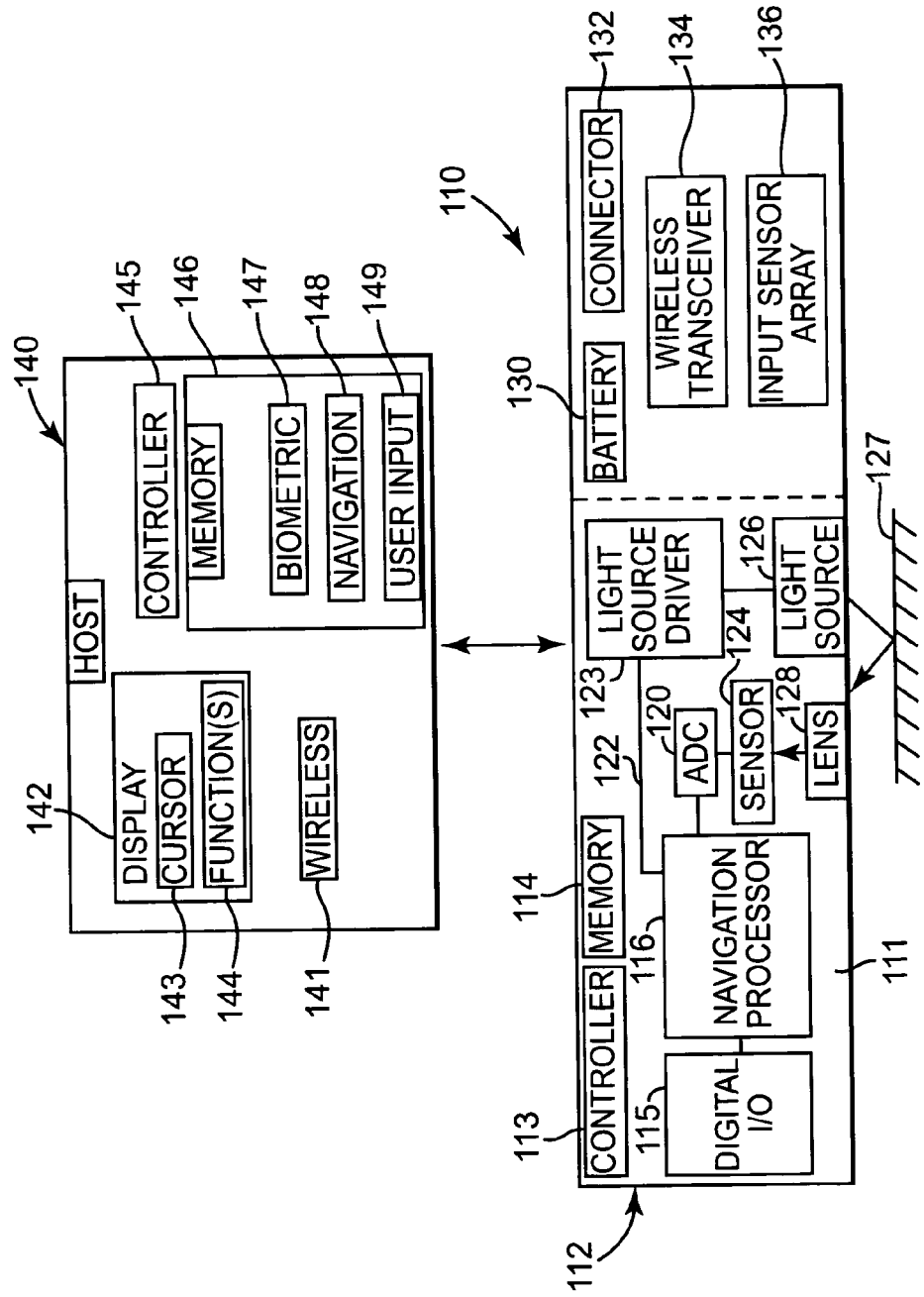
FIG. 8 is a block diagram of a system of a host electronic device and an optical input device, according to an embodiment of the present invention.

FIG. 8 is a block diagram of a system 110 comprising an input device 112 and a host electronic device 140, according to one embodiment of the invention. In one embodiment, host electronic device 140 comprises substantially the same features and attributes as portable computer 12 while input device 112 comprises substantially the same features and attributes as optical input card 14. In one embodiment, battery 130 of optical input device 112 is rechargeable via direct connection to electronic device 140 via connector 132.

As shown in FIG. 8, input device 112 comprises an optical navigation sensor circuit 111 configured to support optical navigation sensing by input device 112. In one embodiment, optical navigation circuit 111 includes controller 113, memory 114, digital input/output 115, navigation processor 116, analog-to-digital converter (ADC) 120, connection 122, light source driver 123, sensor 124, light source 126, and lens 128. In addition, in one embodiment, input device 112 comprises battery 130, connector 132, wireless transceiver 134, and input sensor array 136.

As also shown in FIG. 8, electronic device 140 comprises display 142, such as a graphical user interface, configured to display a cursor (e.g. pointer) 143 and functions 144 of electronic device 140 activatable via display 142 by operation of input device 112. Electronic device 140 comprises controller 145 and memory 146 configured to store a biometric module 147, navigation module 148, and user input module 149, among other information and functions.

As shown in FIG. 8, in one embodiment, sensor module 124 forms a portion of optical navigation sensor integrated circuit (IC) 111 with lens 128 enabling collection of reflected light from a navigation surface 127 to sensor module 124. In one embodiment, sensor module 124 comprises a photodetector array configured as a complimentary metal oxide semiconductor (CMOS) device or a charge coupled device (CCD). Light source 126 is controlled by driver circuit 123, which is controlled by navigation processor 116 via control line 122, and causes light to impinge on navigation surface 127. Sensor module 124 provides signals that vary in magnitude based upon the intensity of light incident on the sensor module 124 after reflection from navigation surface 127. The signals from sensor module 124 are output to analog to digital converter (ADC) 120, which converts the signals into digital values of a suitable resolution. The digital values generated by analog to digital converter (ADC) 120 are output to navigation processor 116, which are stored as a frame within it internal memory or other memory 114.

Different frames of varying light patterns detected via sensor module 124 are compared over time to generate movement information regarding relative movement of navigation surface 127 and sensor module 124. In one aspect, successive frames are compared while in other aspects, non-sequential frames are compared.

In one embodiment, electronic device 140 includes any electronic device cooperable with input device 112 to capture user control inputs. In one aspect, electronic device 140 comprises a phone (e.g., a mobile phone), a personal digital assistant, or a personal computer, such as a portable computer 12 (FIGS. 1-7). However, in another aspect, electronic device 140 is not limited to these examples and encompasses any electronic device including circuitry and by which an optical input card 140 is used to capture user control inputs for operating at least one parameter associated with electronic device 140.

In another embodiment, electronic device 140 also comprises wireless transceiver 141 to enable electronic device 140 to wirelessly communicate with other electronic devices and as well as with wireless transceiver 134 of input device 112. In one aspect, wireless transceiver 141 is configured to send and receive signals via any wireless communication protocol, such as BLUETOOTH®, WIFI®, wireless mobile phone protocols, etc.

It will be understood by a person of ordinary skill in the art that functions performed by sensor module 124 and optical navigation sensor circuit 111, and performed by electronic device 140, including controller 145 and/or memory 146, are implemented in hardware, software, firmware, or any combination thereof. The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

In one embodiment, biometric module 147 of memory 146 enables biometric identification of an individual via fingerprint recognition based on detected relative motion between an optical navigation sensor (via sensor module 124) and a finger tip. This function was previously described in association with FIGS. 4 and 6-7. In one aspect, biometric module 147 enables processing multiple successive frames obtained and produced by optical navigation sensor circuit 111 to construct a fingerprint image. In one aspect, these frames or images are transferred to the host electronic device 140 for storage in memory 146 (with or without normalizing for common image data between successive images). The host electronic device 140 assembles a composite image of the fingerprint from the separate frames or image stored in memory (that were provided by the image sensor). Controller 145 of host electronic device 140 compares that assembled composite image to either a master image (one previously acquired from the user) or to a database of images, in memory 146. One example of fingerprint identification employing an optical navigation sensor is described in Barahav et. al. U.S. patent Publication 2004/0208348.

In another aspect, navigation module 148 of memory 146 enables host electronic device 140 to communicate with input device 112 regarding movement data generated by optical navigation sensor circuit 111 of input device 112 to convert the captured user control inputs into activated functions or positional cursor movement on display 142.

In another aspect, user input module 149 of memory 146 enables host electronic device 140 to communicate with input device 112 regarding activated button functions of input sensor array 136 of input device 112 (e.g., left click activation, right-click activation, scroll functions, etc.) to convert the captured user control inputs into activated functions (e.g., functions 144) or positional cursor movement (e.g., cursor function 143) on display 142 of electronic device 140.

Figure 9:
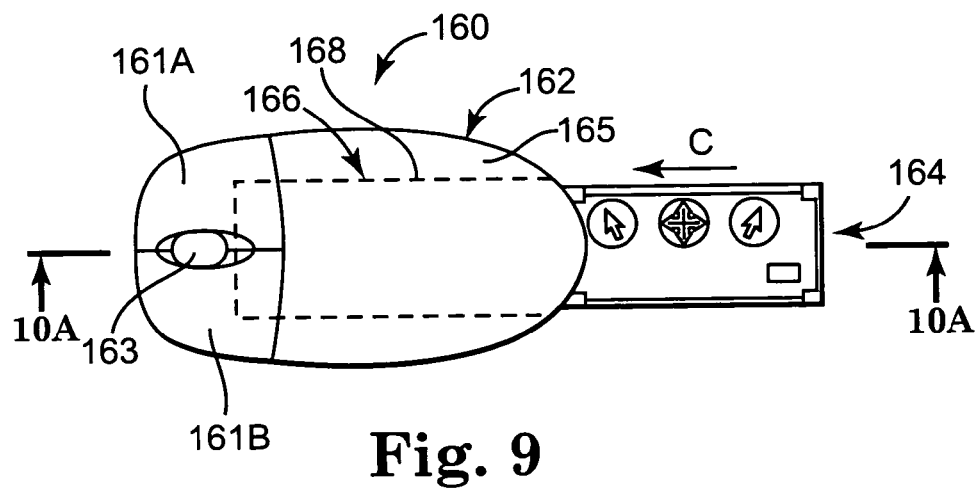
FIG. 9 is top plan view of a system including an optical input card and a mouse shell, according to an embodiment of the present invention.
Figure 11:
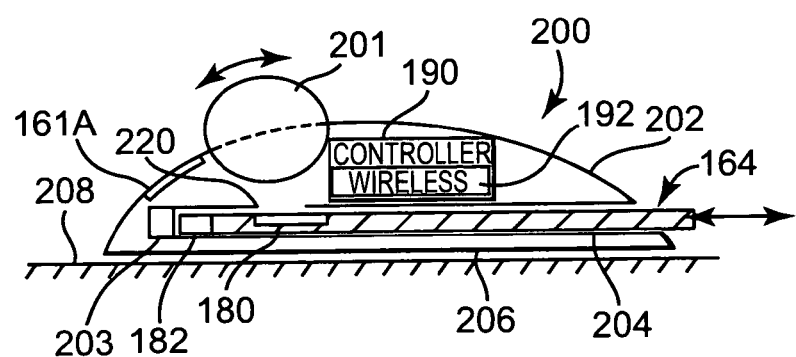
FIG. 11 is a sectional view of a system including an optical input card inserted within a mouse shell, according to an embodiment of the present invention.

FIGS. 9-11 illustrate another mode of use of an optical input card, according to one embodiment of the invention, in which an optical input card is removably inserted into a mouse shell. FIG. 9 is a plan view of a mouse system 160 including a mouse 162 and an optical input card 164 being inserted into slot 166 (shown by dashed lines) of mouse shell 165 (as represented by directional arrow C) with the slot 166 sized and shaped to removably slidably receive the input card 164. Mouse 162 also comprises right click button 161A, left click button 161B, and scroll wheel 163.

Optical input card 164 comprises substantially the same features and attributes of optical input card 14, as previously described in association with FIGS. 1-8. In one aspect, optical input card 164 has a size and shape according to the Express-Card format or the PC Card format. In another aspect, optical input card 14 comprises a size and shape other than the ExpressCard or PC Card format.

Figure 10A:
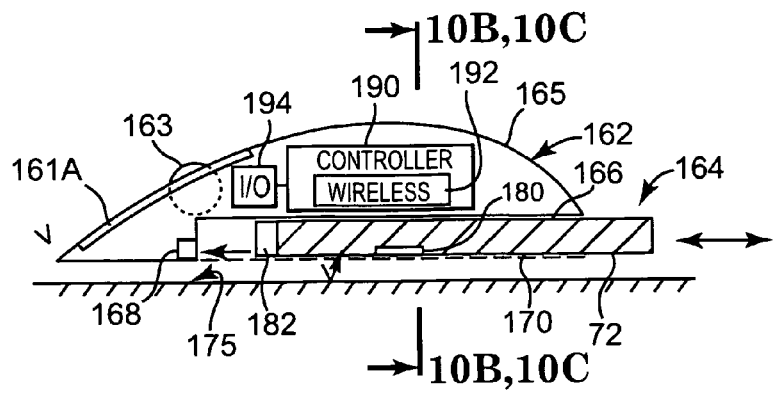
FIG. 10A is a sectional view of the system of FIG. 9 as taken along lines 10A-10A, according to an embodiment of the present invention.

FIG. 10A is a sectional view of a mouse 162 and input card 164, according to one embodiment of the invention. As shown in FIG. 10A, mouse 162 comprises shell 165 defining slot 166 to removably receive input card 164. Shell 165 also comprises connector 168 for releasably connecting to a connector 182 of input card 164 (e.g. substantially the same as first connector 84 of input card 14 shown in FIG. 5) upon insertion of input card 164 into slot 166, as shown in FIG. 10A. This direct connection links buttons 161A, 161B, and scroll wheel 163 of mouse shell 165 to circuitry within optical input card 164 for capturing second user control inputs. Slot 166 is configured to removably receive optical card 164 so that first side 72 of optical input card 164 becomes a bottom portion 170 of mouse 162 for slidable movement over navigation surface 175 (e.g., a desk, mouse pad, etc.) so that optical navigation sensor 180 of input card 164 is positioned to detect relative motion between optical navigation sensor 180 and navigation surface 175. In one aspect, navigation surface 175 is independent of a housing of portable electronic device 14.

In one embodiment, mouse 162 also comprises controller 190 with wireless communication module 192 and input/output device 194. Controller 190 enables capture of user inputs via buttons 161A, 161B, and scroll wheel 163 for communication to portable computer 12 (or electronic device 112 in FIG. 7) as well as for facilitating control over communication of navigation information from optical navigation sensor 180 from input card 164 to the portable computer 12. In one aspect, the user control inputs captured via buttons 161A, 161B and scroll wheel 163 generally correspond to user control inputs captured via control panel 90 of input card 14, 164.

In another embodiment, mouse shell 165 omits controller 190, wireless communication module 192, and input/output device 194. Instead, these functions are provided by the fully functional mouse embodied in optical input card 164. Accordingly, in this embodiment, mouse shell 165 merely provides actuable buttons 161A, 161B, and scroll wheel 163 along with handling ergonomics while optical input card 14 provides substantially all the other functions of mouse 162.

Figure 10B:
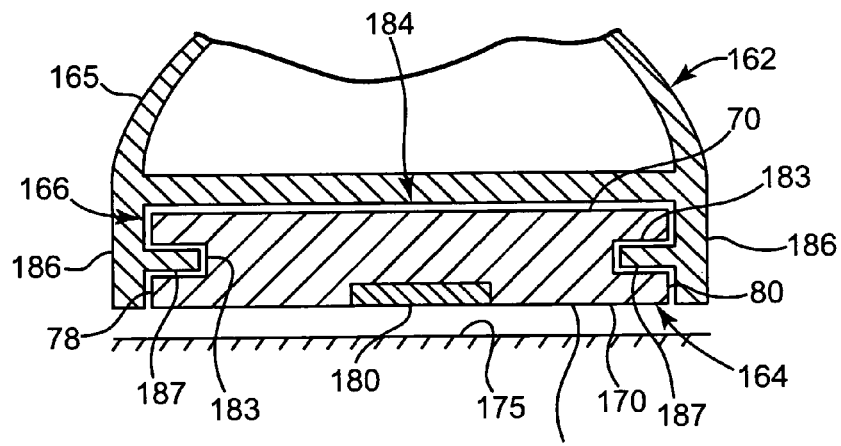
FIG. 10B is a sectional view of the system of FIG. 10A as taken along lines 10B-10B, according to an embodiment of the present invention.

FIG. 10B is a sectional view of mouse 162 of FIG. 10A, according to one embodiment of the invention. As shown in FIG. 10B, mouse shell 165 includes slot 166 which defines cavity 184 having opposed side walls 186 with a detent 187. Optical input card 164 comprises respective side edges 78, 80 which each include a groove 183 sized and shaped to slidably mate with the respective detents 187 of opposed side walls 186. Each side wall 186 is sized so that upon slidable insertion of optical input card 164 into slot 166 via slidable mating of the respective detent(s) 187 and grooves 183, slot 166 positions bottom portion 170 of optical input card 164 to define a bottom surface of mouse 162 for direct contact against navigation surface 175. Accordingly, this arrangement enables optical navigation sensor 180 of optical input card 164 to maintain an optimal height relative to navigation surface 175 after insertion into mouse shell 175.

Figure 10C:
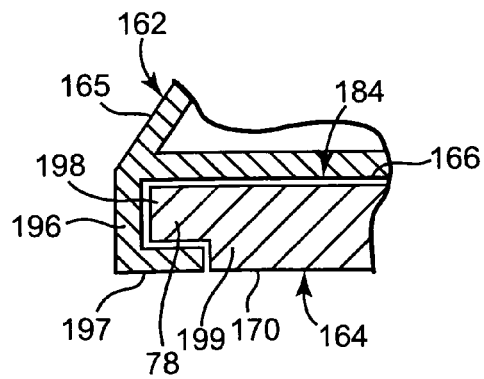
FIG. 10C is a sectional view of the system of FIG. 10A as taken along lines 10C-10C, according to an embodiment of the present invention.

FIG. 10C is a sectional view of mouse 162 of FIG. 10A, according to one embodiment of the invention. As shown in FIG. 10C, shell 165 defines slot 166 via cavity 184 and opposed side walls 196 having flange 197. Optical input card 164 comprises side edges 78, 80 (only edge 78 is shown for illustrative purposes) each defining a flange 198 extending from body 199 of optical input card 164 with flange 197 being sized and shaped to reciprocally slidably mate with optical input card 164 relative to mouse shell 165. This arrangement also insures proper functioning of optical input card 164 in a manner substantially the same as described in association with FIG. 10B.

Embodiments of the invention are not limited to the structures shown in FIG. 10B, 10C, as other coupling structures are suitable for removably receiving optical input card 164 within mouse shell 165.

FIG. 11 is a sectional view of a system including mouse 200 and input card 164, according to one embodiment of the invention. As shown in FIG. 11, mouse 200 comprises shell 202 supporting a trackball arrangement and defining slot 204 to removably receive input card 164. In a manner substantially the same as shell 165 of FIG. 10A, shell 202 in FIG. 11 also comprises connector 203 for releasably connecting to a connector 182 of input card 164 (e.g. substantially the same as first connector 84 of input card 14 shown in FIG. 5) upon insertion of input card 164 into slot 204, as shown in FIG. 11. Shell 202 is configured to support rotational movement or rotational coupling of a spherical member 201 (e.g., a ball) and slot 204 is configured to expose optical navigation sensor 180 of input card 164 (releasably secured within slot 202) to spherical member 201 internally within shell 202 via opening 220. This arrangement is configured to enable finger controlled navigation with optical navigation sensor 180 of input card 164 detecting relative motion between the rotatable spherical member 201 and the optical navigation sensor 180. Bottom portion 206 of shell 202 is configured for stationary positioning on a surface 208, such as a desk.

Mouse 200 also comprises controller 190 with wireless communication module 192 and input/output device (shown in FIG. 10A), substantially the same as for mouse 162 of FIG. 10A. Controller 190 enables capture of user inputs via actuable buttons 161A, 161B (functionally the same as buttons 161A, 161B shown in FIGS. 9 and 10A), and spherical member 201 for communication to a host portable computer 12 (or electronic device in FIG. 7) as well as for facilitating control over communication of navigation information from optical navigation sensor 180 from input card 164 to the host portable computer 12.

In another embodiment, mouse shell 202 omits controller 190, wireless communication module 192, and an input/output device 194. Instead, these functions are provided by the fully functional mouse embodied in optical input card 164. Accordingly, in this embodiment, mouse shell 202 merely provides actuable buttons 161A, 161B, and spherical member 201 along with trackball-type ergonomics on shell 202 while optical input card 164 provides substantially all the other functions of mouse 200.

Figure 12:
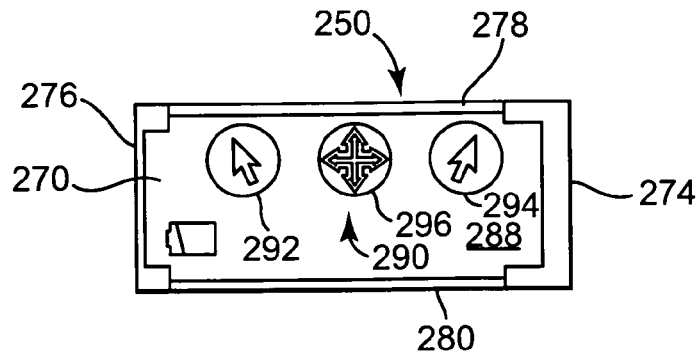
FIG. 12 is a top plan view of an optical input card, according to an embodiment of the present invention.

FIG. 12 is a plan view of an optical input card 250, according to one embodiment of the invention. In one embodiment, optical input card 250 has substantially the same features and attributes as input card 14, 164 (FIGS. 1-11) except having a different size and a modified control panel 290. In one example, optical input card 250 defines a generally rectangular shape and has a substantially uniform thickness. Similarly, in one aspect, optical input card 250 is shaped and sized for removable slidable insertion within a slot of a portable computer, such as slot 42 of housing 22 of portable computer 12, as shown in FIG. 1. In another aspect, as described in association with FIGS. 15-16, input card 250 is sized and shaped for insertion into input interface of portable computer 12. In one embodiment, a size and shape of the card generally corresponds to a size and shape of an ExpressCard, such as an ExpressCard|34 card or ExpressCard|54.

As shown in FIG. 12, optical input card 250 comprises a second side 270, first end 274, second end 276, first edge 278 and second edge 280. In one embodiment, second side 270 of input device 250 and body portion 288. In one aspect, body portion 288 of optical input card 250 defines a substantially continuous planar surface.

As further shown in FIG. 12, a control panel 290 is disposed on the second side 270 of the card for capturing at least one second user control input. In one aspect, control panel 290 comprises first button 292, second button 294, third button 296. In one embodiment, first button 292 corresponds to a left-click function and second button 294 corresponds to a right-click function with a middle, third button 296 comprising a scroll function or general positional function.

In one embodiment, a scroll function is activated as an integrated click-and-scroll in which one finger continually activates a scroll function button 296 to cause scrolling on display 30 upon the substantially concurrent movement (positioning) of the optical input card 250 relative to its navigation surface, with the speed and direction of scrolling corresponding to the speed and direction of movement of the optical input card 250.

In one aspect, a first connector defines a portion of first end 274 of optical input card 250 for releasable connection to a second connector within slot 42 of housing 20 of portable computer 12. This first connector of first end 274 is configured to enable portable computer 12 to recharge a battery of the optical input card 250.

Figure 13:
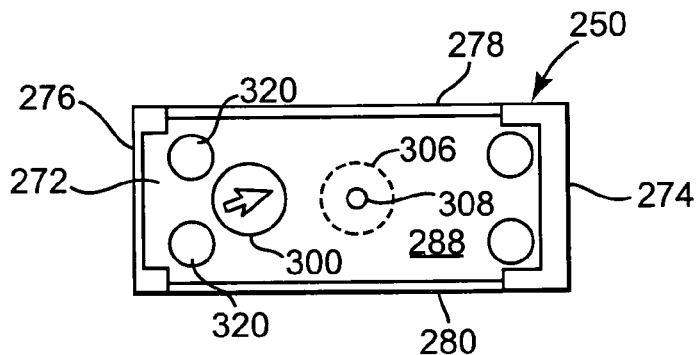
FIG. 13 is bottom plan view of an optical input card, according to an embodiment of the invention.
Figure 14:
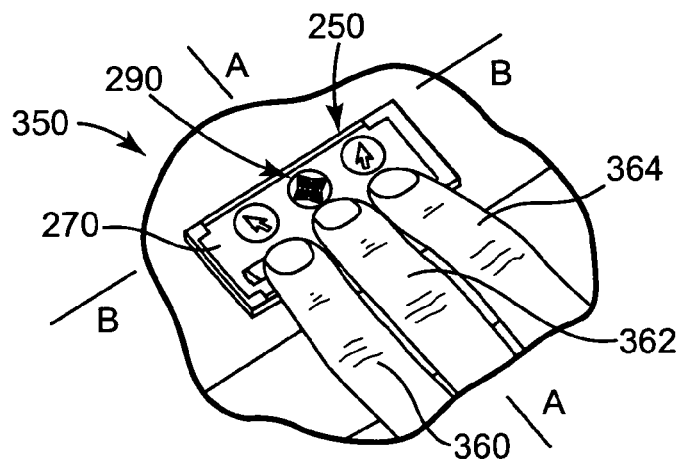
FIG. 14 is an isometric view illustrating a method of use of an optical input card, according to an embodiment of the present invention.

As shown in FIG. 13, first side 272 of optical input card 250 includes control button 300 and optical navigation sensor 306 (represented by dashed lines) with transparent window 308 (e.g., an sealed or unsealed opening) for capturing a first user control input. Optical navigation sensor 306 enables the previously described biometric identification mechanism (FIGS. 4-8) and remote video control mechanism. In another aspect, control button 300 of optical input card 250 is configured to enable the previously described click function for a remote video presentation. In one embodiment, first side 272 also comprises contact shoes 320.

In use, user control inputs are captured via applying fingertip control to the first side 272 and/or second side 270 of optical input card 250, as previously described in association with FIGS. 1-11. In one aspect, optical navigation sensor 306 of optical input card 250 detects relative motion between the optical navigation sensor 306 and a navigation surface for capturing a first user control input. In another aspect, the fingertip(s) of the user are applied to activate one or more buttons of the control panel 290 on the second side 270 of the card 250 (or button 300 on first side 272) to capture the second user control input.

Like optical input card 14, optical input card 250 is configured for use in any one or more of modes of use including deployment on a navigation surface external to a housing of electronic device (FIG. 2), deployment on navigation surface on a housing of an electronic device (FIG. 3), storage within a slot 42 of a portable computer 12, and slidably insertion into a mouse shell (FIGS. 9-11), and/or free hand use (FIG. 4).

Figures 15, 16:
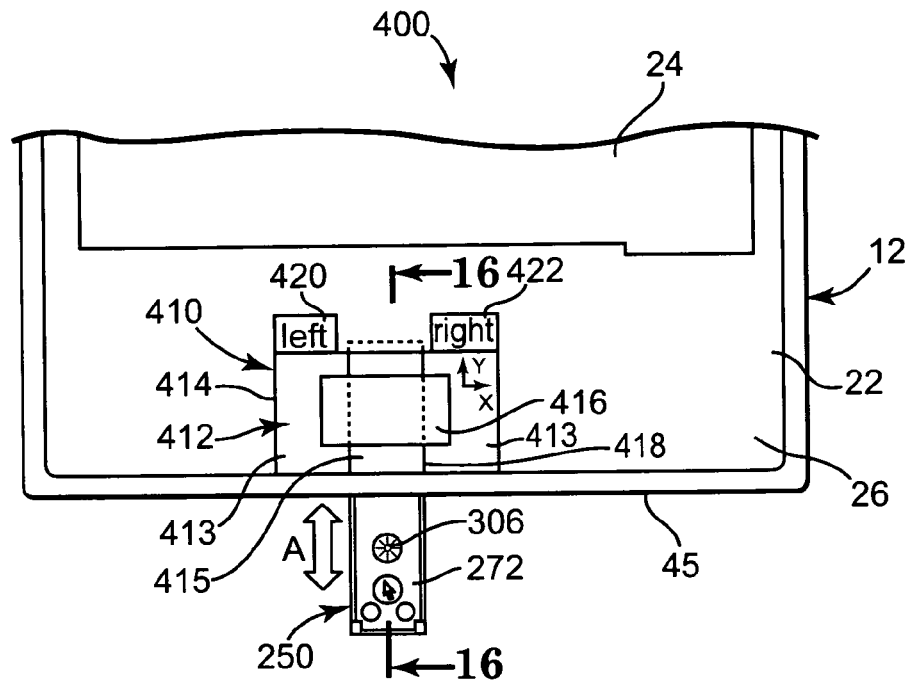
FIG. 15 is a top plan view of a system of a portable computer and an optical input card, according to an embodiment of the present invention.
FIG. 16 is a sectional view of the system of FIG. 15 as taken along lines 16-16, according to an embodiment of the present invention.

In addition, according to another embodiment of the invention, an optical input card 250 is deployed in input interface 410 described in association with FIGS. 15-16, according to another embodiment of the invention.

FIG. 15 is diagram illustrating a partial top view of a portable computer 400 including input interface 410, according to one embodiment of the present invention. FIG. 16 is a sectional view of input interface 410 of FIG. 15, as taken along section line 16-16 of FIG. 15, according to one embodiment of the present invention.

In one embodiment, portable computer 400 comprises substantially the same features and attributes as portable computer 12, as previously described in association with FIGS. 1-14, except having input interface 410 on wrist-rest portion 26 as shown in FIG. 15. In one embodiment, optical input card 250 comprises substantially the same features and attributes as optical input card 14, 164, as previously described in association with FIGS. 1-14.

As shown in FIGS. 15 and 16, input interface 410 includes a support portion 412 and puck 416 arranged for fingertip controlled slidable movement over the support portion 412. In one embodiment, support portion 412 comprises a pair of lateral portions 413 and a central portion 415 defined by a first side 272 of optical input card 250. In combination, the lateral portions 413 and central portion 415 define a substantially planar surface for enabling slidable movement of puck 416 over support portion 412 of input interface 410.

FIG. 15 also illustrates positioning of optical input card 250 prior to slidable insertion into slot 418 (shown in dashed lines, and in FIG. 16), as represented by directional arrow A, to be removably secured as part of input interface 410. As shown in FIG. 15, first side 272 of optical input card 164 250 is facing upwards to enable optical navigation sensor 306 to be exposed to puck 416 when optical input card 250 is fully inserted within slot 418 at front portion 45 of housing 20 of portable computer 400, thereby enabling detection by optical navigation sensor 306 of relative motion between puck 416 and optical navigation sensor 306 to capture a first user control input. In one aspect, the first user control input is captured via a change in position of puck 416 that causes movement of a cursor on display 30 of portable computer 12 (FIG. 1) by a magnitude and a direction that depend on the magnitude and direction of the motion of puck 416.

Once optical input card 250 is fully inserted as shown in FIG. 16, second side 272 of optical input card 250 defines the previously described central portion 415 of support portion 412. In other embodiments, support portion 412 comprises other arrangements for slidably receiving optical input card 250 to expose an optical navigation sensor 306 of optical input card 250 to a bottom surface 452 (FIG. 16) of puck 416 to enable detecting relative motion between the puck 416 and the optical navigation sensor 306.

As shown in FIG. 15, input interface 410 also comprises control buttons 420, 422 for capturing second control user inputs, such as left-click and right-click functions of a mouse. In one aspect, as shown in FIGS. 15-16, recess 414 of wrist-rest portion 26 of portable computer 400 defines an edge that limits the range of slidable motion of puck 416 relative to support portion 412. In another aspect, recess 414 of wrist-rest portion 26 is sized and shaped, and puck 416 is sized and shaped, to maintain at least a portion of puck 416 over optical navigation sensor 306 of optical input card 250. As also shown in FIG. 16, front portion 26A of wrist-rest portion 26 further defines edge of recess 414.

In another aspect, as shown in FIG. 16, optical, input card 250 comprises connector 480 that is configured for releasable connection of connector 482 of input interface 410 to enable wired communication between optical input card 250 and portable computer 400. This wired communication helps to secure optical input card 250 within slot 418, and/or to enable recharging of a battery of optical input card 250. In addition, this wired communication provides one pathway (in addition to wireless communication) for communicating captured user control inputs from optical input card 250 to a controller of portable computer 12.

In one embodiment, slot 418 of input interface 410 is configured with a grooves or a detent, substantially the same as described in association with FIGS. 10B, 10C (or an equivalent structure) to enabling slidable insertion of optical input card 250 into slot 418 to position first side 272 of optical input card 250 to be in substantially the same plane as the rest of support portion 412 provided by lateral portions 413.

In another embodiment, input interface 410 is configured so that optical input card 250 is permanently secured within wrist-rest portion 26 in a substantially similar orientation shown in FIG. 15 to provide an on-board, fully functional optical mouse having an upside down orientation (i.e., optical navigation sensor 306) for use with puck 416 or for finger navigation.

Figure 17:
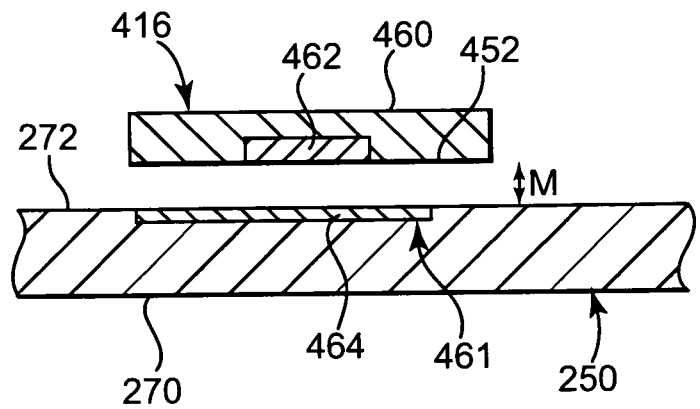
FIG. 17 is a sectional view of a magnetic coupling mechanism of an input interface, according to an embodiment of the invention.

FIG. 17 is an enlarged sectional view of input interface 410 including a magnetic coupling mechanism 461, according to one embodiment of the invention, with optical input card 250 inserted into slot 418. As shown in FIG. 17, puck 416 comprises a bottom navigation surface 452 and body 460 of puck 416 comprises an embedded magnetic member 462. Optical input card 250 comprises first side 272, second side 270, and magnetic component 464. In use, the reciprocal magnetic attraction (as represented by arrow M) of magnetic member 462 of puck 416 and magnetic component 464 of optical input card 250 maintains puck 416 in slidably coupled relationship with optical input card 250. In another embodiment, magnetic component 464 is incorporated into lateral portion 413 of input interface 410 (FIG. 15) so that the magnetic coupling of puck 416 to input interface 410 is not dependent on magnetic component 464 being within optical input card 250. In one embodiment, one of magnetic component 462 and 464 comprise a magnetically responsive material such as a ferrous material. The magnetic coupling mechanism prevents inadvertent loss or damage to puck 416 and facilitates maintaining an intended position of puck 416, such as when a housing of a portable computer 400 is tilted at an angle away from a generally horizontal plane.

Figure 18:
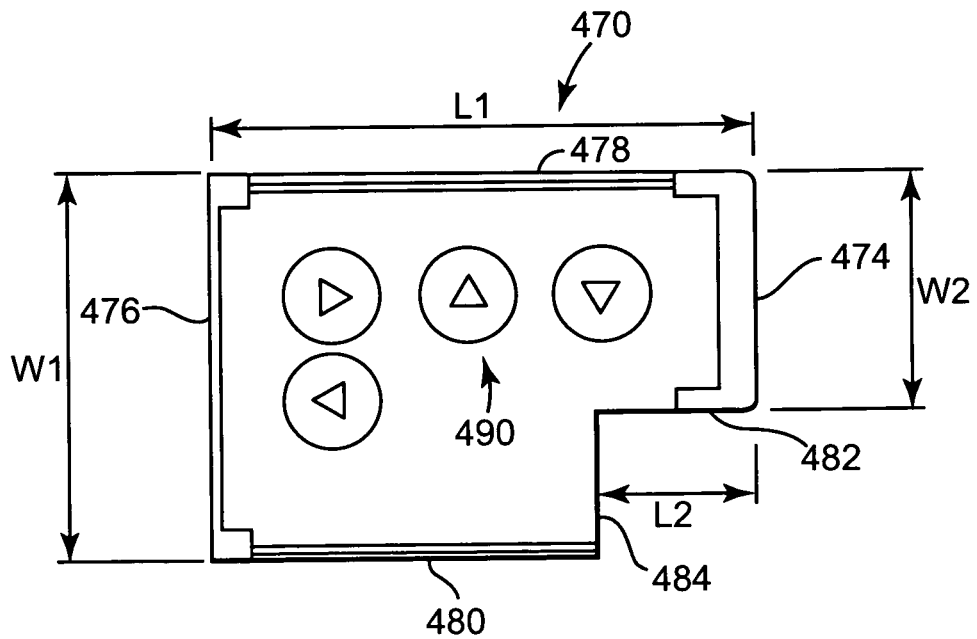
FIG. 18 is a top plan view of an input device, according to an embodiment of the present invention.

FIG. 18 is a top plan view of an optical input card 470, according to one embodiment of the invention. As shown in FIG. 17, optical input card 470 comprises an optical input card having substantially the same features and attributes as the optical input cards 14, 164, 250 described in association with FIGS. 1-17, except having a size and shape in accordance with the ExpressCard|54 Card format. This larger card provides more space for additional circuitry (e.g., battery, memory, processing, optics packages, etc.) as well as more surface area for fingertip control of the card. Optical input card 470 comprises first end 474, second end 476, side edges 478, 480 and control panel 490. First end 474 also comprises an extension portion 482 having a length (L2) extending outwardly from base portion 484 of optical input card 470. Extension portion 482 has a width (W2) substantially equal of the ExpressCard|34 format.

In another embodiment, an optical navigation sensor of an optical input card comprises an optics apparatus a lens array including a plurality of micro-lenses positioned adjacent to each other to enable a low profile optics apparatus. In one aspect, this low profile optics apparatus enables a sensor (e.g. sensor module 124 in FIG. 8) to be positioned at a distance of on the order of about 5 millimeters (e.g., 3 to 7 millimeters) relative to a navigation surface so that an optical input card 14, 164, 250, 470 will have an overall thickness corresponding to a thickness of a PCCard or an ExpressCard, according to the PCMCIA standards.

In one embodiment, an optics apparatus comprises a light source and a sensor array positioned proximately within a housing and with the sensor array mounted on a substrate. A lens array is interposed between the sensor array and the surface to be imaged (e.g., a navigation surface) such that a 1:1 image of the navigation surface (e.g., a finger tip, mouse pad, slider, etc.) is formed onto the two-dimensional (2D) sensor array. The lens array comprises a plurality of micro-lenses extending in generally the same plane. In one aspect, the lens array is configured so that each micro-lens matches an individual pixel on the sensor array. In another aspect, each micro-lens of the lens array is used to cover a group of pixels on the sensor. The micro-lenses are positioned such that the image is formed onto the sensor array or is formed in a plane in space such that the image is defocused from the surface.

Figure 19:
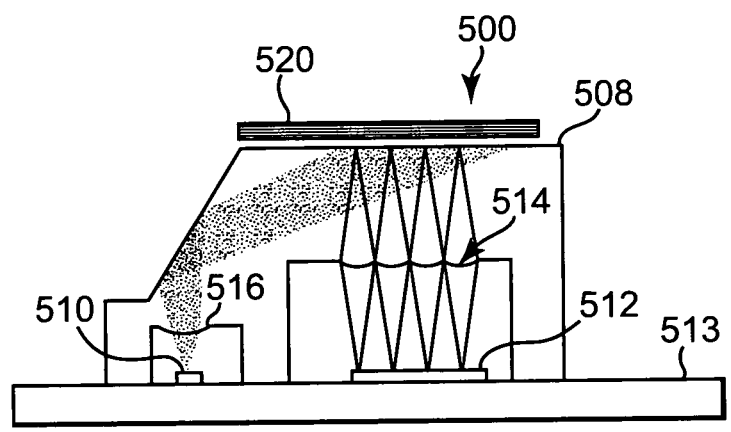
FIG. 19 is a side view schematically illustrating an optics apparatus, according to an embodiment of the present invention.
Figure 20A:
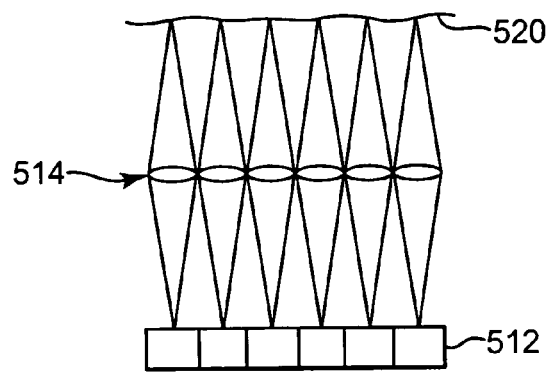
FIG. 20A is a side view schematically illustrating a lens array of the optics apparatus, according to an embodiment of the present invention.
Figure 20B:
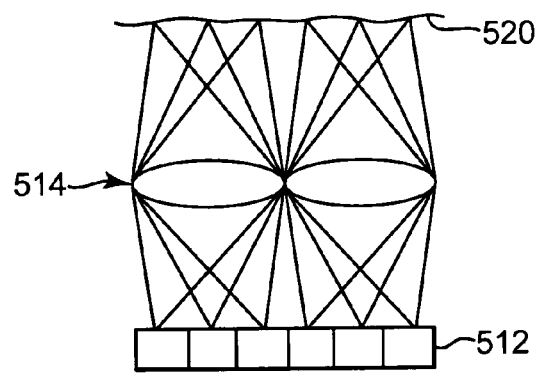
FIG. 20B is a side view schematically illustrating a lens array of the optics apparatus, according to an embodiment of the present invention.
Figure 20C:
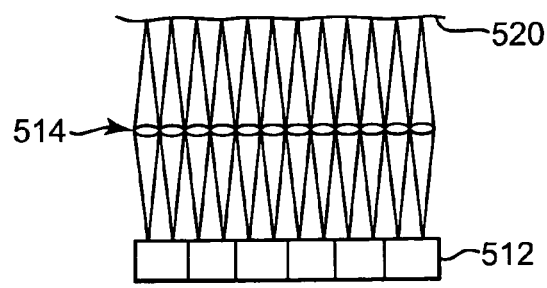
FIG. 20C is a side view schematically illustrating a lens array of the optics apparatus, according to an embodiment of the present invention.

As shown in FIG. 19, in one embodiment of the present invention, an optics apparatus 500 including a micro-lens array is used in place of the single imaging lens in a conventional optical navigation device. Within a housing 508 of optics apparatus 500, a light source 510 and a sensor array 512 are positioned proximately. The sensor array 512 is mounted on a substrate 513, e.g. a printed circuit board (PCB). A lens array 514 is positioned such that the light emitted from the light source 510 is reflected off a navigation surface 520. The lens array 514 includes M×N elements (e.g. micro-lenses), where M>1 and N≥1. The lens array 514 collects the reflected light off the navigation surface 520, and forms a pattern onto the 2D sensor array 512 underneath. For example, when a LED is used as the light source 510, the lens array 514 is used to form an image of the navigation surface, such as a fingertip, mouse pad, or slider. As shown in FIGS. 20A-20C, each element (e.g., micro-lens) of the lens array 514 is designed to match individual pixels on the sensor array 512 (FIG. 20A), or each element of the lens array 514 is used to cover a group of pixels on the sensor array 512 (FIG. 20B), or each element of the lens array is used to cover a fraction of one pixel area on the sensor array 512 (FIG. 20C). The lens array 514 is positioned such that the image of the navigation surface 520 is formed onto the sensor array 512, or is formed, in a plane in space that is different from the navigation surface 520, onto the sensor array.

In one embodiment, an optional lens 516 is placed between the light source 510 and the navigation surface 520 where the output beam is substantially collimated. Light is referred to illustratively.

In another embodiment, the inventive concept is extended to include electromagnetic radiation over a wavelength range extending from about 1 nanometer (nm) to about 1 meter (m).

In one embodiment, the overall height of the optics apparatus 500, and therefore a height (e.g., thickness) of optical input card 14, 164, 250, 470 is significantly reduced relative to a conventional optical mouse because the focal length of each element (e.g., micro-lens) of the lens array 514 can be very short while still maintaining the same f/# of a single lens element.

In one embodiment, the illumination source 510 is a coherent light source such as a laser diode or a vertical cavity surface emitting laser. Alternatively, illumination source 510 is an incoherent or quasi-coherent light source such as a light emitting diode (LED) or a broadband source with or without an optical filter.

In one embodiment, the lens array 514 is comprised of elements that are refractive, diffractive or hybrid. The sensor array 512 is a charge coupled device (CCD) or a complementary metal oxide semiconductor (CMOS) imaging array.

The sensor array 512 is positioned to capture the pattern formed by the lens array 514. This pattern either directly corresponds to the navigation surface 520, or is a derivative of surface information, e.g. speckles or interference patterns produced from the reflected light off the navigation surface 520.

The optics apparatus 500 significantly reduces the spacing required between the navigation surface 520 and the sensor array 512 using a different optical design concept, therefore resulting in a reduced overall height of the navigation sensor (e.g. optical navigation sensor 106, 306) of an optical input card. This reduced height, in turn, enables optical input card 14, 164, 250, 470 to have a reduced thickness. In one aspect, the reduced thickness optical input card substantially corresponds with a thickness of a PC Card format or an ExpressCard format. In another aspect, the reduced thickness optical input card has a thickness different than the PC Card or ExpressCard format.

As illustrated in FIG. 19, by using a multiple element (micro-lens) lens array, the surface-to-sensor array distance is dramatically reduced while maintaining the same optical properties, e.g. magnification and f/#, of a single lens implementation using the same sensor array. Light collection efficiency of the imaging lens is designed to be equal or better than in the case of a single element lens. The micro-lens array is designed such that each element corresponds to one pixel of the sensor array, or each element maps images to a group of pixels in the sensor, or each pixel in the sensor corresponds to a group of lens elements.

Manufacturing of a micro-lens arrays is achieved in many ways such as etching, reflow, replication or molding. According to one embodiment of the present invention, the lens array is integrated to the sensor array at a wafer level. In another embodiment, the lens array is a separate piece that is placed in between the navigation surface and the sensor array 512.

In one embodiment, an optical apparatus, such as optical apparatus 500 of FIGS. 19 and 20A-20C, comprises a housing, an M×N array of elements for collecting electromagnetic waves from a surface (where M>1 and N≥1), and a motion detection circuit, having a sensor array for receiving the electromagnetic waves, determining relative motion in the directions along the first and second axes. Moreover, the electromagnetic waves are selected from a group that includes visible light, infrared light, microwave, sonic waves. A light source is positioned within the housing, operable to emit the electromagnetic wave towards the surface.

In one aspect, each element of the M×N array corresponds to at least a fraction of a sensor in the sensor array while in another aspect, each element of the M×N array directly corresponds to a single sensor in the sensor array. In yet another aspect, each element of the M×N array corresponds to a group of sensors in the sensor array. In another aspect, each element of the M×N array is a lens and the lens comprises at least one of a refractive, diffractive or hybrid element. In one embodiment, the light source emits visible or infrared light. In one aspect, the light source is one of a coherent, quasi-coherent, and non-coherent light source. In another aspect, the light source is a coherent light source, the coherent light source selected from a group consisting of laser diodes and vertical cavity surface emitting lasers. In another aspect, the light source is a non-coherent or quasi-coherent light source, the light source selected from a group consisting of light emitting diodes (LED) and broadband light sources. In one embodiment, the M×N array is positioned to form a pattern of the surface onto the sensor array while in another embodiment, the M×N array is positioned to form an image of a plane in space that is different from the surface onto the sensor array. These formed patterns are selected from a group including speckle, diffraction, and surface images.

In one embodiment, a method of optical sensing via optical apparatus 500 of FIGS. 19-20C comprises applying an electromagnetic source towards a surface, forming a pattern corresponding to a reflection of the surface by applying a an M×N array of collection elements, where M>1 and N≥1, detecting a series of patterns using a sensor array, and analyzing the patterns to determine relative motion. In one aspect, the electromagnetic source emits light in the optical wavelength range and the pattern is selected from a group including speckle, diffraction, and surface images.

In another aspect, the light source is a coherent light source selected from a group consisting of laser diodes and vertical cavity surface emitting lasers. In one aspect, the light source is one of a non-coherent and a quasi-coherent light source, with the light source selected from a group consisting of light emitting diodes (LED) and broadband light source. In one more aspect, the M×N array is positioned to form a pattern of the surface onto the sensor array. In another aspect, the M×N array is positioned to form an image of a plane in space that is different from the surface onto the sensor array.

Accordingly, an optics apparatus 500, according to embodiments of the invention, enable a low profile or reduced thickness optical input card.

Embodiments of the invention provide an enhanced mobile computing experience by providing a low profile, fully functional mouse that is separable from a housing of a portable computer, yet is stowable within the housing of the portable computer when not in use. The size and shape of the optical input card also enables many other modes of use that are not readily achievable with an external conventional optical mouse nor by conventional on-board input devices of portable computers. Accordingly, embodiments of the invention provide a universal optical input card configured for interchangeable use in a plurality of different modes of use.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An input device comprising:
   a mouse shell configured to support a spherical member that is rotatably coupled to the mouse shell so that user can manually rotate the spherical member, the mouse shell including:
   a wireless communication module;
   a control panel configured to capture a first user control input for controlling at least one function of a computing device via the wireless communication module; and
   a slot sized and shaped for slidable removable insertion of an optical navigation card including an optical navigation sensor into the slot of the mouse shell to position the optical navigation card such that a surface of the spherical member attached to the mouse shell is exposed to the optical navigation sensor of the optical navigation card when the optical navigation card is inserted into the slot for detection of relative motion between the optical navigation card and the surface of the spherical member to capture a second user control input for controlling the at least one function of the computing device via the wireless communication module, the optical navigation card being configured such that the surface of the spherical member is optically imaged by the optical navigation sensor as the surface of the spherical member is rotated relative to the optical navigation sensor to capture the second user control input.

2. The input device of claim 1 wherein the optical navigation card comprises a wireless communication module configured to wirelessly communicate with at least one of the computing device and a controller within the shell of the input device.

3. The input device of claim 1 wherein the slot of the shell comprises a connector for releasably fixed wired communication between the optical navigation card and a controller within the shell of the input device and the control panel of the shell is coupled to a control panel of the optical navigation card.

4. A user control input device, comprising:
   a card including a first side and a second side opposite the first side and the card being shaped and sized as at least one of a PCCard and an ExpressCard for removable slidable insertion within a PCCard slot or ExpressCard slot of a portable computer, the card comprising;
   an optical navigation sensor disposed on the first side of the card for exposure to a navigation surface and configured to capture a first user control input;
   a control panel on the second side of the card configured to capture at least one second user control input; and
   a wireless communication module configured to wirelessly communicate the first user control input and the at least one second user control input to the portable computer,
   wherein the optical navigation sensor comprises a housing including a sensor array of pixels and a micro-lens array of micro-lenses, the number of the micro-lenses included in the micro-lens array being at least equal to the number of the pixels included in the sensor array so that each individual pixel on the sensor array corresponds to a different micro-lens of the micro-lens array on a one-to-one basis.

5. An input device comprising:
   a mouse shell configured to support a spherical member that is rotatably coupled to the mouse shell so that user can manually rotate the spherical member, the mouse shell including:
   a wireless communication module;
   a control panel configured to capture a first user control input for controlling at least one function of a computing device via the wireless communication module; and
   a slot sized and shaped for slidable removable insertion of an optical navigation card including an optical navigation sensor into the slot of the mouse shell to position the optical navigation card such that a navigation surface on which the input device is positioned is exposed to the optical navigation sensor of the optical navigation card when the optical navigation card is inserted into the slot for detection of relative motion between the optical navigation card and the navigation surface to capture a second user control input for controlling the at least one function of the computing device via the wireless communication module.

* * * * *